US009093167B2

(12) United States Patent
Jung

(10) Patent No.: US 9,093,167 B2
(45) Date of Patent: Jul. 28, 2015

(54) OSCILLATOR CIRCUIT WITH LOCATION-BASED CHARGE PUMP ENABLE AND SEMICONDUCTOR MEMORY INCLUDING THE SAME

(71) Applicant: SK hynix Inc., Icheon-si, Gyeonggi-do (KR)

(72) Inventor: TaeHyung Jung, Santa Clara, CA (US)

(73) Assignee: SK hynix Inc., Icheon-si (KR)

( * ) Notice: Subject to any disclaimer, the term of this patent is extended or adjusted under 35 U.S.C. 154(b) by 291 days.

(21) Appl. No.: 13/685,493

(22) Filed: Nov. 26, 2012

(65) Prior Publication Data

US 2014/0146608 A1    May 29, 2014

(51) Int. Cl.
*G11C 5/14* (2006.01)
*G11C 16/20* (2006.01)
*G11C 16/30* (2006.01)

(52) U.S. Cl.
CPC ............ *G11C 16/20* (2013.01); *G11C 5/145* (2013.01); *G11C 16/30* (2013.01)

(58) Field of Classification Search
CPC .................. G11C 5/145; G11C 16/30
USPC .............. 365/189.09, 185.11, 230.03
See application file for complete search history.

(56) References Cited

U.S. PATENT DOCUMENTS 7,619,945 B2 * 11/2009 Norman .................. 365/226
2010/0052771 A1   3/2010 Hartono

* cited by examiner

*Primary Examiner* — Vu Le
(74) *Attorney, Agent, or Firm* — Kilpatrick Townsend & Stockton LLP

(57) ABSTRACT

A semiconductor memory includes a plurality of memory blocks each comprising a plurality of memory cells, and a plurality of charge pumps each located near one of the plurality of memory blocks. In an access to the semiconductor memory, depending on the selected memory block, a subset or all of the plurality of charge pumps are activated in one of a predetermined number of sequences.

20 Claims, 7 Drawing Sheets

OSCILLATOR CIRCUIT WITH LOCATION-BASED CHARGE PUMP ENABLE AND SEMICONDUCTOR MEMORY INCLUDING THE SAME

BACKGROUND OF THE INVENTION

The continuing advancement in semiconductor process technology enables packing larger amounts of memory on an integrated circuit die. Because of the large size of the memory, it is customary to break up the memory array into multiple banks, and access only the selected bank in a given memory access. In memory devices where charge pumps are needed in order to provide on-die supply voltages greater than that provided externally, multiple charge pumps are typically needed in order to provide the requisite amount of current. In conventional designs, these pumps are typically activated with no regard to the location of circuit blocks or memory banks that are activated in a given memory access. Either all pumps are activated at once, which can cause power surge and noise, or the pumps are activated in a predetermined sequence. In the latter case, if in a given access to the memory device, the first activated pump happens to be far from the selected memory bank, the time delay in the pump voltage reaching the selected memory bank can adversely impact the performance of the memory device.

Thus, there is a need for techniques to improve the manner in which charge pumps are activated in memory devices.

SUMMARY

In accordance with an embodiment, a semiconductor memory includes a plurality of memory blocks each comprising a plurality of memory cells, and a plurality of charge pumps each located near one of the plurality of memory blocks. In an access to the semiconductor memory, depending on the selected memory block, a subset or all of the plurality of charge pumps are activated in one of a predetermined number of sequences.

In accordance with another embodiment, a method of operating a semiconductor memory having a plurality of charge pumps each located near one of a plurality of memory blocks, includes accessing one of the plurality of memory blocks, and activating a subset or all of the plurality of charge pumps in one of a predetermined number of sequences.

DETAILED DESCRIPTION OF THE INVENTION

In accordance with exemplary embodiments, the sequence in which charge pumps in a memory device are activated is dependent on the location of the selected memory bank, and thus can vary from one memory access to another. FIGS. 1, 2, 3, 4, 5 and 6A-6D will be used to describe one embodiment in which such technique is implemented.

Figure 1:
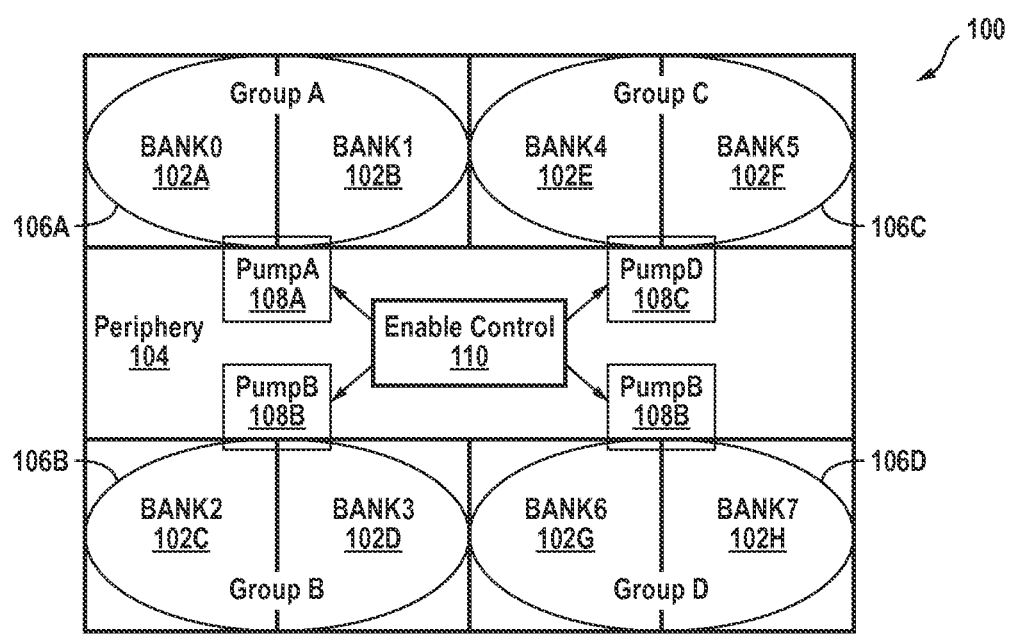
FIG. 1 is a top view of a memory device 100.
Figure 2:
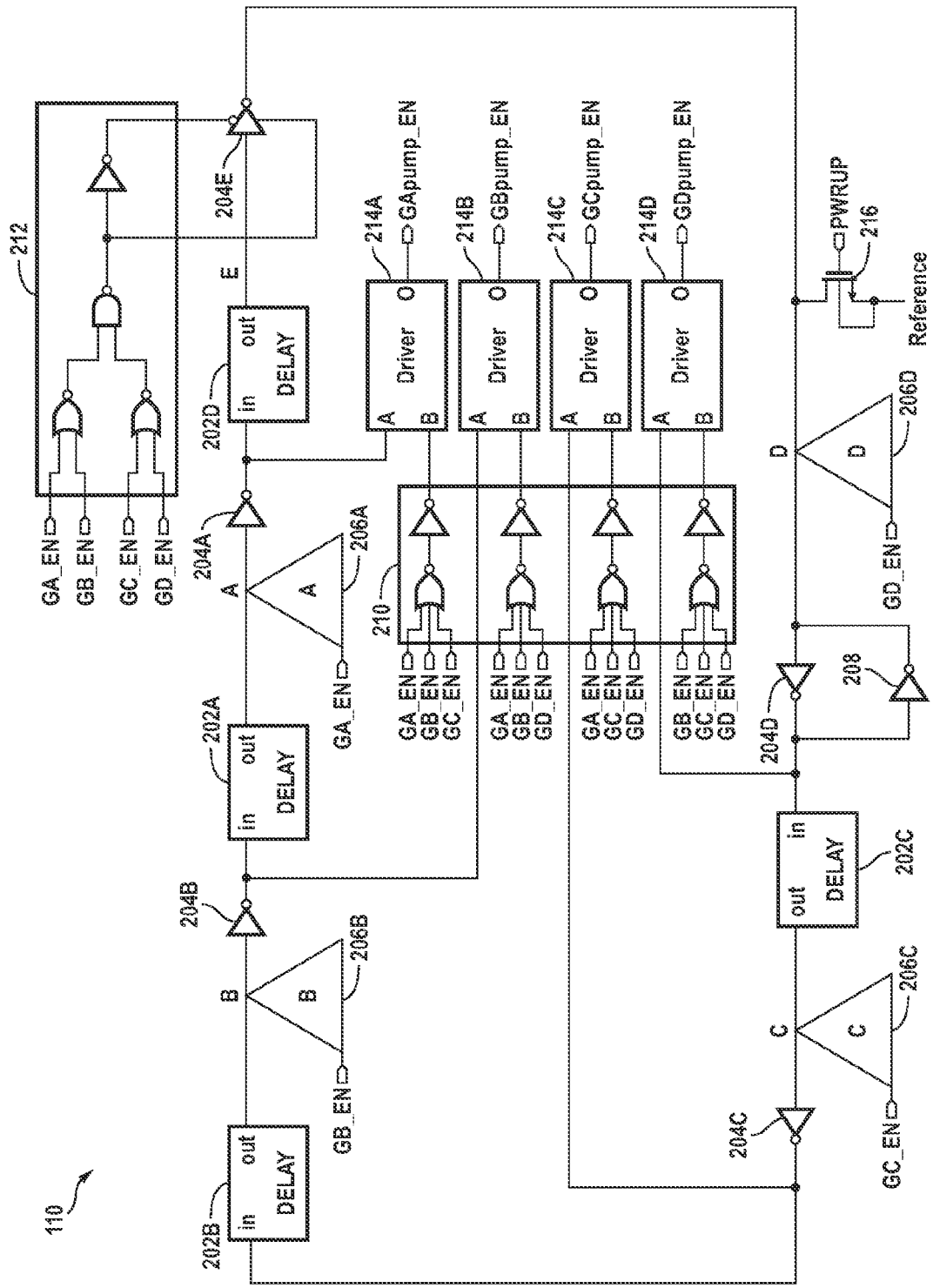
FIG. 2 is an Enable Control circuit configured to generate enable signals for selective activation of pumps.

FIG. 1 shows a top view of a memory device 100. Memory device 100 includes eight memory banks BANK0-BANK7 respectively marked with reference numerals 102A-102H. The top four banks are separated from the bottom four banks by periphery area 104 where part or all of the peripheral circuitry is housed. The eight banks are grouped into four Groups as follows: BANK0 and BANK1 are grouped as Group A marked with reference numeral 106A; BANK2 and BANK3 are grouped as Group B marked with reference numeral 106B; BANK4 and BANK5 are grouped as Group C marked with reference numeral 106C; and BANK6 and BANK7 are grouped as Group D marked with reference numeral 106D. A charge pump may be located in close proximity to each of the four groups. PumpA marked with reference numeral 108A is located in close proximity to the banks in Group A. PumpB marked with reference numeral 108B is located in close proximity to the banks in Group B. PumpC marked with reference numeral 106C is located in close proximity to the banks in Group C 106C. PumpD marked with reference numeral 108D is located in close proximity to the banks in Group D. The output terminals of the four charge pumps may be connected together. In some embodiments, the output terminals of at least two of the charge pumps are connected together. An Enable Control circuit 110 located in periphery region 104 generates enable signals for selective activation of the four pumps. An implementation of Enable Control circuit 110 is shown in FIG. 2, which will be described next.

Enable Control circuit 110 receives power up signal PWRUP and four group enable signals GA_EN, GB_EN, GC_EN and GD_EN, and in response generates four pump enable signals GApump_EN, GBpump_EN, GCpump_EN and GDpump_EN which are respectively coupled to enable or disable charge pumps PumpA, PumpB, PumpC and PumpD in FIG. 1. In a given access to memory device 100, one of the group enable signals GA_EN, GB_EN, GC_EN and GD_EN is activated depending on the selected bank. For example, if Bank0 or Bank1 is selected, GA_EN is activated; if Bank2 or Bank3 is selected, GB_EN is activated; if Bank4 or Bank5 is selected, GC_EN is activated; and, if Bank6 or Bank7 is selected, GD_EN is activated. The circuitry generating the group enable signals GA_EN, GB_EN, GC_EN and GD_EN based on the selected bank would be known to one skilled in this art in view of this disclosure, and thus is not disclosed herein.

Figure 3:
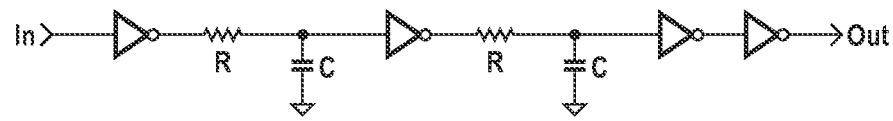
FIG. 3 is a circuit diagram showing the details of delay circuits 202A-202D in FIG. 2.
Figure 4:
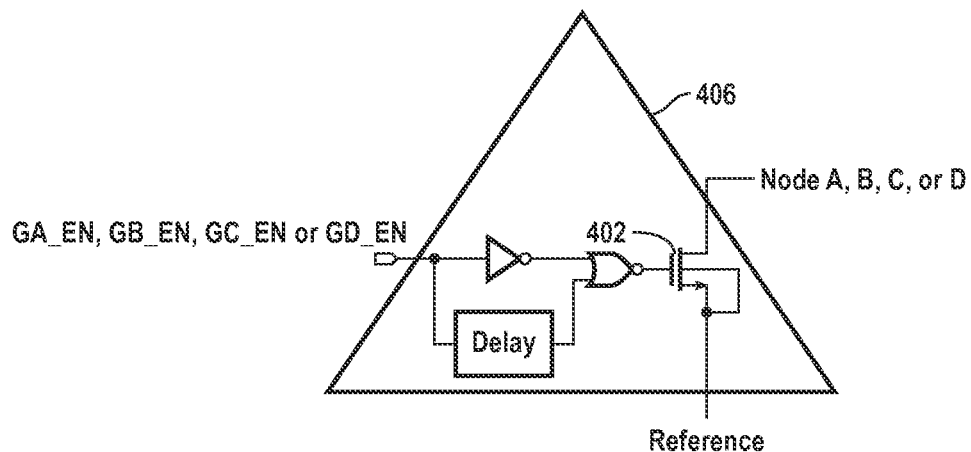
FIG. 4 is a circuit diagram showing the details of reset circuits 206A-206D in FIG. 2.

Enable Control circuit 110 includes an oscillator circuit made up of 4 delay circuits 202A-202D and 5 inverters 204A-204E serially connected as shown to form an oscillator ring. An exemplary implementation of delay circuits 202A-202D is shown in FIG. 3, and will be described in more detail further below. Four reset circuits 206A, 206B, 206C and 206D represented in FIG. 2 by triangular blocks are connected to various nodes in the oscillator ring. An exemplary implementation of reset circuits 206A-206D is shown in FIG. 4, which will be described in more detail further below. Enable Control circuit 110 further includes NMOS pull-down transistor 216 with its gate connected to power up signal PWRUP, its drain connected to node D of the ring oscillator, and its source connected to reference potential (e.g., ground potential). Transistor 216 together with the latch circuit made up of cross-coupled inverters 204D and 208 ensure that the ring oscillator powers up properly when memory device 100 is powered up.

Figure 5:
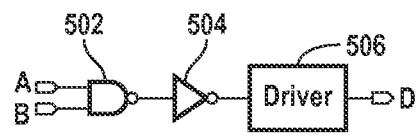
FIG. 5 is a circuit diagram showing the details of driver blocks 214A-214D in FIG. 2.

Logic block 210 and driver blocks 214A-214D receive group enable signals GA_EN, GB_EN, GC_EN, GD_EN as well as signals from various nodes in the oscillator ring, and in turn generate pump enable signals GApump_EN, GBpump_EN, GCpump_EN and GDpump_EN. An exemplary implementation of driver circuit blocks 214A-214D is shown in FIG. 5 which will be described more fully further below. Logic block 212 receives group enable signals GA_EN, GB_EN, GC_EN, GD_EN, and in response outputs two signals that are coupled to control the operation of inverter 204E.

FIG. 3 is a circuit diagram showing the details of delay circuits 202A-202D. The delay circuit in FIG. 3 has an even number of inverters integrated with an RC network to provide the desired delay. Other techniques for obtaining the desired delay may also be used.

FIG. 4 is a circuit diagram showing the details of reset circuits 206A-206D in FIG. 2. The reset circuit includes a conventional one-shot pulse generator which generates a pulse at the input of transistor 402 in response to a low-to-high transition at its input. Thus, when any of group enable signals GA_EN, GB_EN, GC_EN, GD_EN makes a low-to-high transition, the corresponding reset circuit forces the node to which it is connected (e.g., nodes A, B, C, D) to a low state for the duration of the pulse. FIG. 5 is a circuit schematic showing the details of driver blocks 214A-214D in FIG. 2. A two-input NAND gate 502 receives signals at its inputs A and B, and has its output connected to inverter 504. Inverter 504 in turn has its output connected to an input of a conventional driver circuit 506 capable of driving a capacitive load. Next, the operation of Enable Control circuit 110 will be described in more detail with reference to the timing diagrams in FIGS. 6A-6D.

Figure 6A:
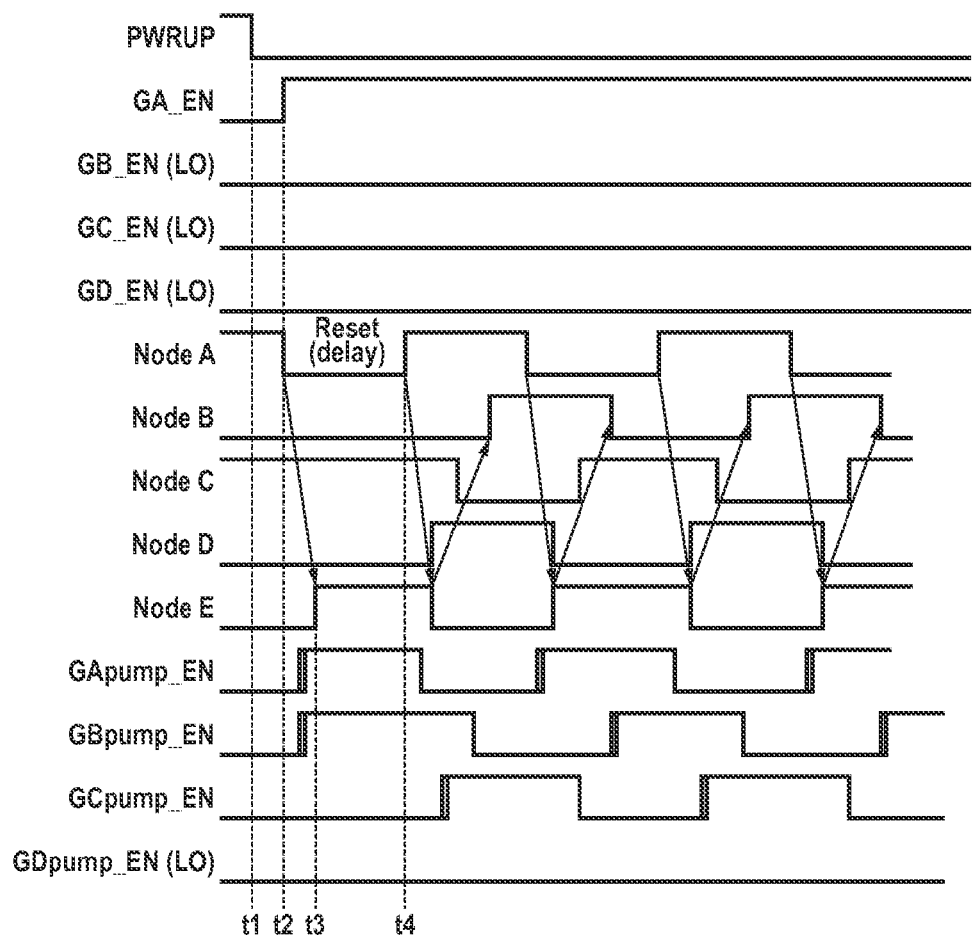
FIGS. 6A-6D are timing diagrams used to describe the operation of the Enable Control circuit in FIG. 2.

As FIGS. 6A-6D illustrate, Enable Control circuit 110 is designed so that depending on the location of the selected bank, the charge pump closest to the corresponding group is activated first. This ensures that the selected bank receives power right away thus improving memory performance. Additionally, activation of the pumps is staggered in order to reduce noise and peak current. Moreover, the logic implementation advantageously uses the delay circuits already present in the ring oscillator thus eliminating the delay circuits that would otherwise be needed at the output of the ring oscillator for staggering activation of the pumps. FIG. 6A shows the timing diagram for the case where a bank in Group A is selected. Prior to time t1 when power up signal PWRUP is high, NMOS transistor 216 together with the latch circuit comprising cross-coupled inverters 204D and 208 operate to lock Enable Control circuit 110 in a predetermined state as reflected by the state of the signals at nodes A-E in FIG. 6A. With PWRUP signal transitioning low at time t1, NMOS transistor 216 is turned off and Enable Control circuit 210 is allowed to operate under the control of group enable signals GA_EN, GB_EN, GC_EN, GD_EN. As can be seen in FIG. 6A, immediately after the PWRUP signal goes low, with all the group enable signals in the low state, the state of Enable Control circuit 210 remains unchanged. It is noted that with all group enable signals in the low state, logic block 212 places inverter 204E in hi-z or tri-state, thus allowing the latch made up of cross-coupled transistors 204D and 208 to maintain the state of node D after transistor 216 is turned off.

At time t2, group enable signal GA_EN goes high indicating that a bank in Group A is selected. All other group enable signals remain low. GA_EN signal going high causes reset circuit 206A to force node A low for the duration of the pulse at the input of transistor 402 (FIG. 4). This duration corresponds to the period between t2 and t4 when node A is low, and is marked in FIG. 6A as "Reset(delay)." When GA_EN goes high at time 2, logic circuit 210 and driver blocks 214A and 214B cause pump enable signals GApump_EN and GBpump_EN to go high, thus activating charge pumps PumpA 108A and PumpB 108B located near Group A 106A. Pump enable signal GApump_EN remains high for the duration that node A is in the low state. The low to high transition at node A at time t4 propagates through the ring oscillator causing nodes E, D, C and B to sequentially transition as shown. In this manner, after the expiration of the "Reset (delay)" at time t4, nodes A-E transition one after another as dictated by the time delay associated with delay circuits 202A-202D in the ring oscillator. Thus, subsequent to time t4, pumps A-C are activated in a staggered manner. While pump D is not activated at all in the FIG. 6A scenario, the design may be modified so that pump D is also activated in a staggered manner relative to the other pumps.

Figure 6B:
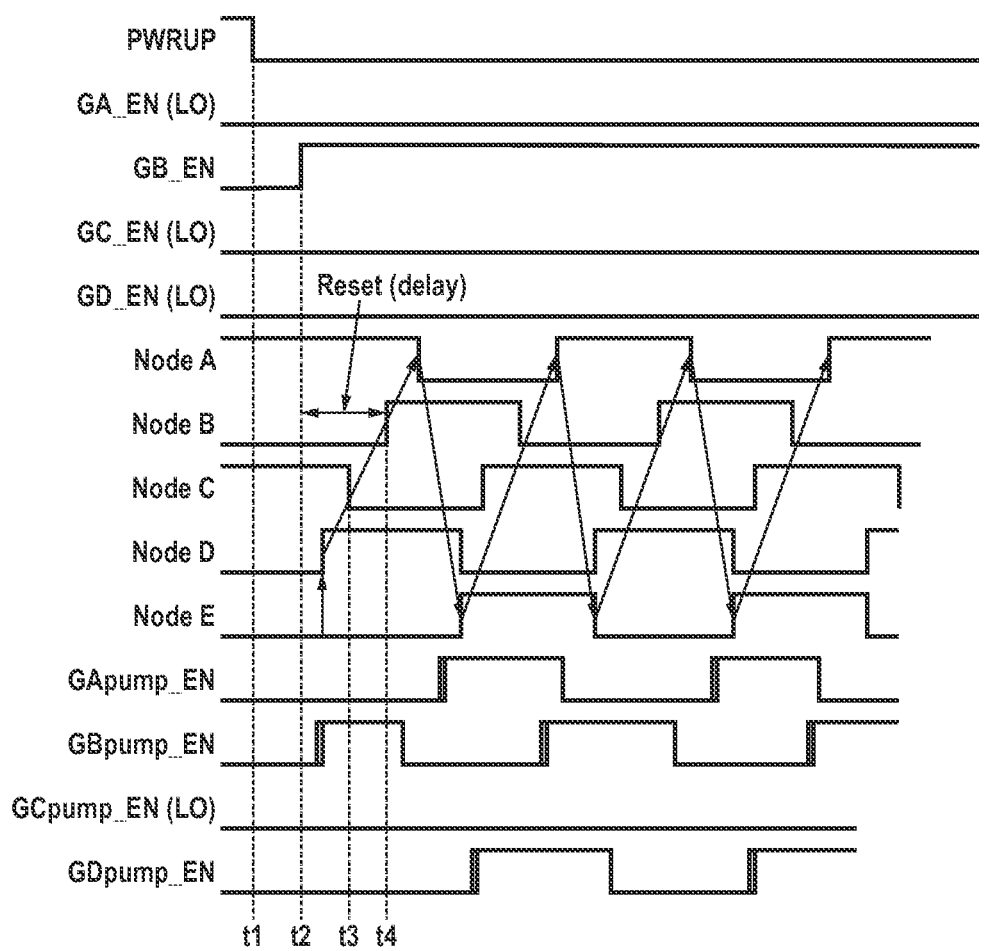

FIG. 6B shows the timing diagram for the case where a bank in Group B is selected. As in the FIG. 6A scenario, prior to time t1 when power up signal PWRUP is high, transistor 216 and the latch comprising inverters 204D and 208 operate to lock the Enable Control circuit 110 in a predetermined state as reflected by the state of the signals at nodes A-E. With PWRUP signal transitioning low at time t1, Enable Control circuit 210 is allowed to operate under the control of group enable signals GA_EN, GB_EN, GC_EN, GD_EN. Immediately after the PWRUP signal goes low, with all group enable signals in the low state, the state of Enable Control circuit 216 remains unchanged. At time t2, group enable signal GB_EN goes high indicating that a bank in Group B 106B is selected. All other group enable signals remain low. GB_EN signal going high causes reset circuit 206B to force node B to stay in the low state for the duration of the pulse at the input of transistor 402 (FIG. 4). This duration corresponds to the period between t2 and t4 when node B is low, and is marked in FIG. 6B as "Reset(delay)." When GB_EN goes high at time t2, logic circuit 210 and driver blocks 214A and 214B cause pump enable signal GBpump_EN to go high, thus activating charge pump PumpB 108B located near Group B 106B.

When GB_EN signal goes high at time t2, logic circuit 212 activates inverter 204E. Upon activation, with a low logic level at its input, inverter 204E causes its output (node D) to transition from low to high. This is represented in FIG. 6B by the arrow pointing upward from node E to node D. The low to high transition on node D propagates through the ring oscillator causing nodes C, B, and A to sequentially transition as shown. In this manner, with the "Reset (delay)" having expired prior to time t4, nodes A-E transition one after another as dictated by the time delay associated with delay circuits 202A-202D in the ring oscillator. Thus, subsequent to time t4, pumps A, B and D are activated in a staggered manner, as shown. While pump C is not activated at all in the FIG. 6B scenario, the design may be modified so that pump C is also activated in a staggered manner relative to the other pumps.

Figure 6C:
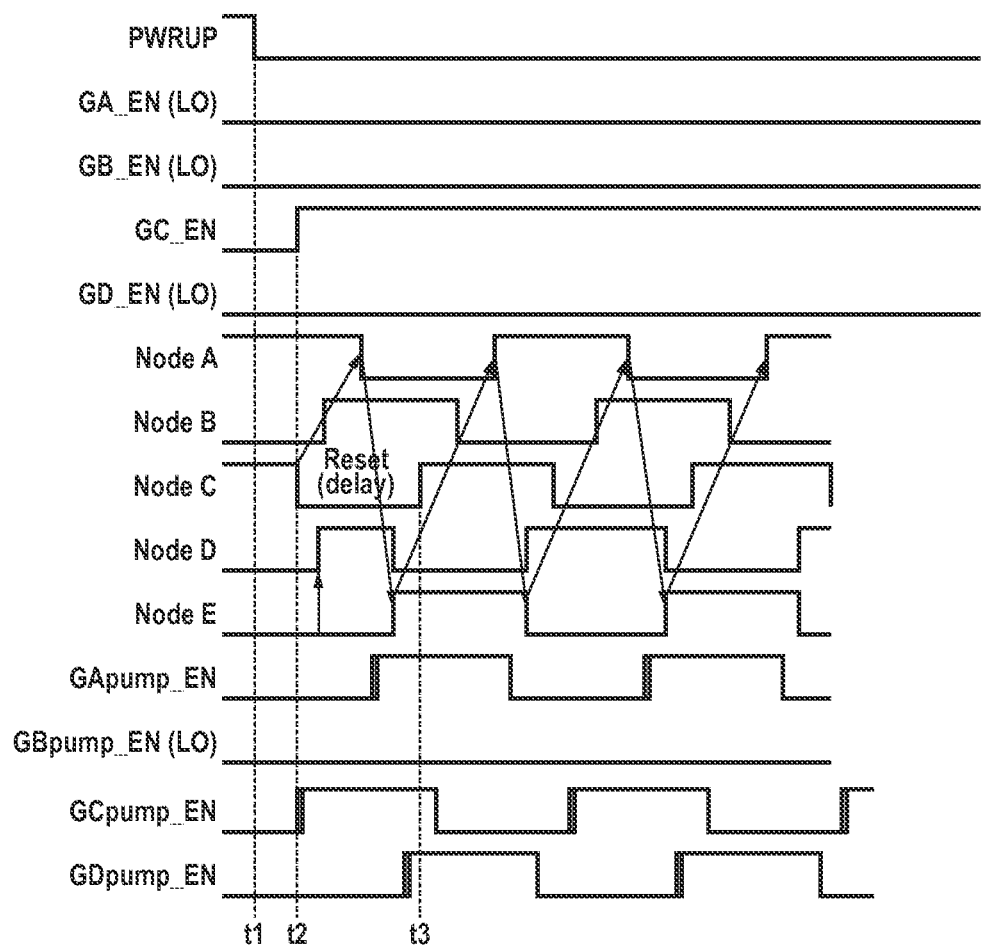

FIG. 6C shows the timing diagram for the case where a bank in Group C is selected. As in the FIG. 6A scenario, prior to time t1 when power up signal PWRUP is high, transistor 216 and the latch comprising inverters 204D and 208 operate to lock the Enable Control circuit 110 in a predetermined state as reflected by the state of the signals at nodes A-E. With PWRUP signal transitioning low at time t1, NMOS transistor 216 is turned off and Enable Control circuit 210 is allowed to operate under the control of group enable signals GA_EN, GB_EN, GC_EN, GD_EN. As can be seen in FIG. 6C, immediately after the PWRUP signal goes low, with all the group enable signals in the low state, the state of Enable Control circuit 210 remains unchanged. At time t2, group enable signal GC_EN goes high indicating that a bank in Group C is selected. All other group enable signals remain low. GC_EN signal going high causes reset circuit 206C to force node C low for the duration of the pulse at the input of transistor 402 (FIG. 4). This duration corresponds to the period between t2 and t3 when node C is low, and is marked in FIG. 6C as "Reset(delay)." When GC_EN goes high at time t2, logic circuit 210 and driver block 214C cause pump enable signals GCpump_EN to go high, thus activating charge pump PumpC 108C located near Group C 106C. When GC_EN signal goes high at time t2, logic circuit 212 activates inverter 204E. Upon activation, with a low logic level at its input, inverter 204E causes its output (node D) to transition from low to high. This is represented in FIG. 6C by the arrow pointing upward from node E to node D.

Figure 6D:
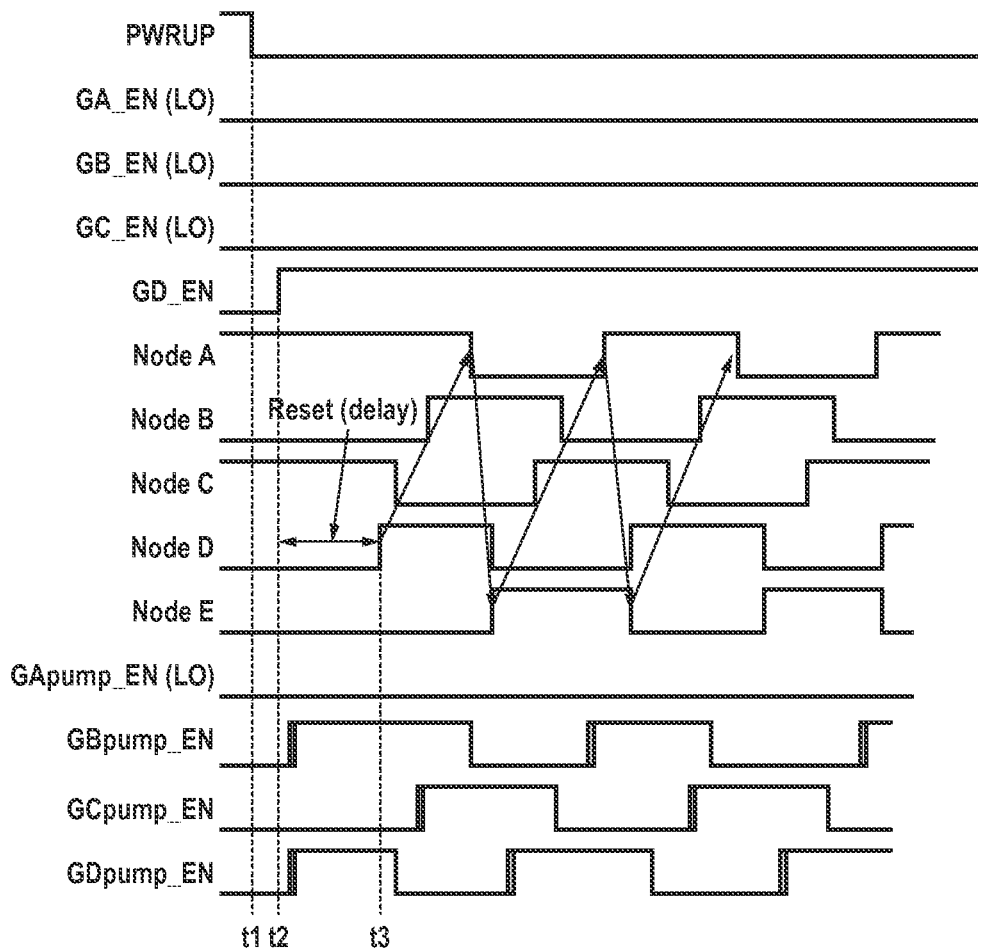

The high to low transition at node C at time t2 propagates through the ring oscillator causing nodes B, A and E to sequentially transition as shown. In this manner, nodes A-E transition one after another as dictated by the time delay associated with delay circuits 202A-202D in the ring oscillator. Thus, pumps A, C and D are activated in a staggered manner, as shown. While pump B is not activated at all in the FIG. 6C scenario, the design may be modified so that pump B is also activated in a staggered manner relative to the other pumps FIG. 6D shows the timing diagram for the case where a bank in Group D is selected. As in the FIG. 6A scenario, prior to time t1 when power up signal PWRUP is high, NMOS transistor 216 together with the latch circuit comprising cross-coupled inverters 204D and 208 operate to lock Enable Control circuit 110 in a predetermined state as reflected by the state of the signals at nodes A-E in FIG. 6D. With PWRUP signal transitioning low at time t1, NMOS transistor 216 is turned off and Enable Control circuit 210 is allowed to operate under the control of group enable signals GA_EN, GB_EN, GC_EN, GD_EN. As can be seen in FIG. 6D, immediately after the PWRUP signal goes low, with all the group enable signals in the low state, the state of Enable Control circuit 210 remains unchanged.

At time t2, group enable signal GD_EN goes high indicating that a bank in Group D is selected. All other group enable signals remain low. GD_EN signal going high causes reset circuit 206D to force node D low for the duration of the pulse at the input of transistor 402 (FIG. 4). This duration corresponds to the period between t2 and t3 when node D is low, and is marked in FIG. 6D as "Reset(delay)." When GD_EN goes high at time t2, logic circuit 210 and driver blocks 214B and 214D cause pump enable signals GBpump_EN and GDpump_EN to go high, thus activating charge pumps PumpB 108B and PumpD 108D located near Group D 106D. The low to high transition at node D at time t3 propagates through the ring oscillator causing nodes C, B, A and E to sequentially transition as shown. In this manner, after the expiration of the "Reset (delay)" at time t3, nodes A-E transition one after another as dictated by the time delay associated with delay circuits 202A-202D in the ring oscillator. Thus, subsequent to time t3, pumps B-D are activated in a staggered manner. While pump A is not activated at all in the FIG. 6D scenario, the design may be modified so that pump A is also activated in a staggered manner relative to the other pumps.

Figure 7:
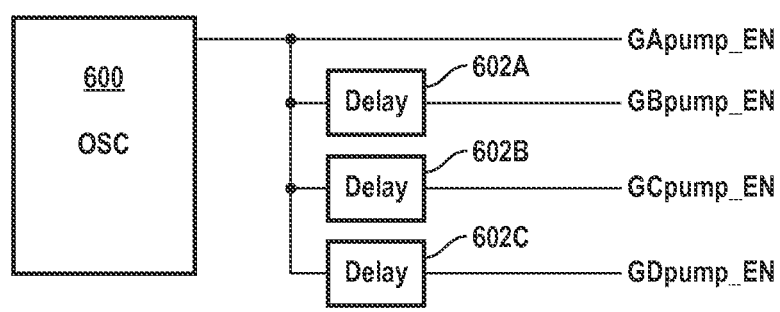
FIG. 7 is a circuit diagram illustrating an implementation in which delay circuits for staggering activation of charge pumps are located at the output of the oscillator.

Thus, as FIGS. 6A-6D illustrate, upon detecting the selected bank, Enable Control circuit 110 ensures that the charge pump closest to the selected bank is activated first. Also, activation of the pumps is staggered in order to reduce noise and peak current. Additionally, the circuit implementation in FIG. 2 advantageously uses the delay circuits 202A-202D already present in the ring oscillator thus eliminating the delay circuits that would otherwise be needed at the output of the ring oscillator for staggering activation of the pumps. It is however noted that the location-based activation technique described above can also be incorporated in implementations where the delay circuits are placed at the output of the ring oscillator, as shown in FIG. 7.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A semiconductor memory, comprising:
    a plurality of memory blocks each comprising a plurality of memory cells; and
    a plurality of charge pumps each located near one of the plurality of memory blocks,
    wherein in an access to the semiconductor memory, depending on the selected memory block, a subset or all of the plurality of charge pumps are activated in one of a predetermined number of sequences.

2. The semiconductor memory of claim 1 wherein in a first activation cycle of each of the predetermined number of sequences, less than all of the plurality of charge pumps are activated.

3. The semiconductor memory of claim 2 wherein in each of the predetermined number of sequences, at least the charge pump located closest to the selected memory block is activated in the first activation cycle.

4. The semiconductor memory of claim 1 wherein in at least one of the predetermined number of sequences, at least one charge pump located closest to the selected memory block is activated in a first activation cycle.

5. The semiconductor memory of claim 1 wherein after a first activation cycle, no two or more of the plurality of charge pumps are activated at the same time.

6. The semiconductor memory of claim 1 wherein in at least one of the predetermined number of sequences, no two or more of the plurality of charge pumps are activated at the same time.

7. The semiconductor memory of claim 1 wherein in at least one of the predetermined number of sequences, at least one of the plurality of charge pumps remains deactivated.

8. The semiconductor memory of claim 1 further comprising:
    a ring oscillator comprising delay blocks coupled in a ring formation; and
    a logic block configured to receive signals from intermediate nodes of the ring oscillator as well as block select signals indicating which of the plurality of memory blocks is selected in an access to the memory, and in response generate pump enable signals for activating the plurality of charge pumps in one of the predetermined number of sequences.

9. The semiconductor memory of claim 8 further comprising a plurality of reset circuits each coupled to a different node in the ring oscillator, each reset circuit including a one-shot pulse generator configured to generate a pulse in response to a block select signal, wherein the reset circuit forces the potential at the oscillator node to which it is coupled to a predetermined voltage level for the duration of the pulse.

10. The semiconductor memory of claim 1 wherein each of the plurality of charge pumps has an output terminal, wherein the output terminal of the plurality of charge pumps are connected together.

11. A method of operating a semiconductor memory comprising a plurality of charge pumps each located near one of a plurality of memory blocks, the method comprising:
accessing one of the plurality of memory blocks; and
activating a subset or all of the plurality of charge pumps in one of a predetermined number of sequences.

12. The method of claim 11 wherein in a first activation cycle of each of the predetermined number of sequences, less than all of the plurality of charge pumps are activated.

13. The method of claim 12 wherein in each of the predetermined number of sequences, at least the charge pump located closest to the selected memory block is activated in the first activation cycle.

14. The method of claim 11 wherein in at least one of the predetermined number of sequences, only the charge pump located closest to the selected memory block is activated in a first activation cycle.

15. The method of claim 11 wherein after a first activation cycle, no two or more of the plurality of charge pumps are activated at the same time.

16. The method of claim 11 wherein in at least one of the predetermined number of sequences, no two or more of the plurality of charge pumps are activated at the same time.

17. The method of claim 11 wherein in at least one of the predetermined number of sequences, two charge pumps located closest to the selected bank are activated in a first activation cycle.

18. The method of claim 11 wherein in at least one of the predetermined number of sequences, at least one of the plurality of charge pumps remains deactivated.

19. The method of claim 11 wherein the semiconductor memory further includes a ring oscillator having delay blocks coupled in a ring formation, and a logic block coupled to the ring oscillator, the method further comprising:
receiving a first group of signals from intermediate nodes of the ring oscillator at a first group of input terminals of the logic block;
receiving block select signals at a second group of input terminals of the logic block, the block select signals indicating which of the plurality of the memory blocks is selected in an access to the memory; and
in response to the first group of signals and the block select signals, generating pump enable signals at output terminals of the logic block, for activating the plurality of charge pumps in one of the predetermined number of sequences.

20. The method of claim 19 wherein the semiconductor memory further includes a plurality of reset circuits each coupled to a different node in the ring oscillator, and each reset circuit includes a one-shot pulse generator, the method further comprising:
generating a pulse at an output terminal of one of the one-shot pulse generators in response to a block select signal, wherein the corresponding reset circuit forces the potential at the oscillator node to which it is coupled to a predetermined voltage level for the duration of the pulse.

* * * * *